US008730679B2

(12) United States Patent
Wang

(10) Patent No.: US 8,730,679 B2
(45) Date of Patent: May 20, 2014

(54) ELECTRICALLY CONNECTING MODULE

(75) Inventor: Shi-Feng Wang, Shanghai (CN)

(73) Assignee: Inventec Corporation, Taipei (TW)

( * ) Notice: Subject to any disclaimer, the term of this patent is extended or adjusted under 35 U.S.C. 154(b) by 323 days.

(21) Appl. No.: 13/399,304

(22) Filed: Feb. 17, 2012

(65) Prior Publication Data
US 2013/0063900 A1    Mar. 14, 2013

(30) Foreign Application Priority Data

Sep. 8, 2011   (CN) .......................... 2011 1 0265388

(51) Int. Cl.
*H05K 7/10*           (2006.01)
(52) U.S. Cl.
USPC ........... 361/725; 361/727; 361/755; 439/374; 439/382; 439/527
(58) Field of Classification Search
USPC ........................................................ 361/725
See application file for complete search history.

(56) References Cited

U.S. PATENT DOCUMENTS

| 6,560,114 | B2 * | 5/2003 | Berry et al. | 361/727 |
| 6,839,237 | B2 * | 1/2005 | Berry et al. | 361/727 |
| 8,289,692 | B2 * | 10/2012 | Franz et al. | 361/679.33 |
| 2003/0081386 | A1 * | 5/2003 | Robillard et al. | 361/724 |
| 2003/0161114 | A1 * | 8/2003 | Berry et al. | 361/727 |
| 2003/0193781 | A1 * | 10/2003 | Mori | 361/725 |
| 2011/0051342 | A1 * | 3/2011 | Crippen et al. | 361/679.4 |
| 2013/0063900 | A1 * | 3/2013 | Wang | 361/726 |

FOREIGN PATENT DOCUMENTS

| TW | 577556 | 2/2004 |
| TW | M337947 U | 8/2008 |
| TW | 201023437 A | 6/2010 |
| TW | M384335 | 7/2010 |

* cited by examiner

*Primary Examiner* — Anthony Q Edwards
(74) *Attorney, Agent, or Firm* — CKC & Partners Co., Ltd.

(57) ABSTRACT

An electrically connecting module suitable for an electronic device is provided. The electronic device includes a chassis disposed in a rack. The rack has an electrically connecting terminal. The electrically connecting module includes a shell, an adjustable position-limiting element, a circuit board and a connector. The adjustable position-limiting element connects the shell to the chassis. The shell is able to move relatively to the chassis. The circuit board is disposed in the shell. The connector is disposed on the circuit board and electrically connected to the circuit board. When the chassis enters the rack, the electrically connecting terminal presses the shell to adjust the position of the shell, such that the connector is connected to the electrically connecting terminal. When the chassis is pulled out from the rack, the connector is moved with the chassis such that the connection between the connector and the rack is terminated.

14 Claims, 5 Drawing Sheets

ELECTRICALLY CONNECTING MODULE

CROSS-REFERENCE TO RELATED APPLICATION

This application claims the priority benefit of China application serial no. 201110265388.4, filed Sep. 8, 2011. The entirety of the above-mentioned patent application is hereby incorporated by reference herein and made a part of this specification.

BACKGROUND OF THE INVENTION

1. Field of the Invention

The invention relates to an electrically connecting module. Particularly, the invention relates to an electrically connecting module suitable for an electronic device.

2. Description of Related Art

A server is a computer located in the core of a network system to service all other connected computers. A server computer provides network users their needed storage and printing services. It also enables all network clients to share the resources within the network environment. The basic structure of a server computer is quite similar to a Personal Computer which consists of one or more CPUs, Memory, Input/Output devices and other components. They are connected to an internal Bus which connects to the CPU(s) and Memory through a North-Bridge controller chip and connects to Input/Output devices through a South-Bridge controller chip. The server chassis has evolved through three generations: the tower chassis, the rack mounted chassis (which provides good centralization), and the blade server (which provides high density computing capability).

Rack mounted servers, for example, have standardized outside dimensions which fit standard sized racks so that their cabinets can be standardized also. That is, rack mounted servers are an optimized version of tower servers. The purpose of its design is to reduce to the minimum the amount of space taken up by the servers. Most professional network equipments such as switches, routers and hardware firewalls have adopted rack mounted structure. They are flat like desk drawers. A server rack has a standard width of 19 inches. Height is measured in the unit of U where 1 U is 1.75 inches or 44.45 mm. Heights such as 1 U, 2 U, 4 U, 5 U, 7 U are commonly used with rack mounted servers.

The size of a typical cabinet also conforms to industry standards, usually from between 22 U and 42 U. Inside the cabinet, at each U heights, there are removable sliding support structure. Users may make adjustments according to the height of his network equipments such as servers, routers and disk array drives. When the equipment is installed into rack and cabinet, all of their input/output cables are brought out from the rear of cabinet (rack mounted servers have their input/output interfaces in the rear also). All cables are then placed within the cable conduit of the cabinet. Labels are attached to the cables for easier maintenance and management.

Generally speaking, all operation units inside a rack mounted server must connect to outside devices and power supplies through network cables and power cables. With the increasing density of computing and storage units inside the cabinet, the number of network cables and power cables becomes so large as to make it difficult to manage and to connect or remove cables. A large number of cables piled up in the rear of cabinets tend to block air flow which makes heat dissipation a problem.

SUMMARY OF THE INVENTION

The invention is directed to an electrically connecting module which can reduce the number of cables needed for an electronic device containing the electrically connecting module.

The invention is directed to an electrically connecting module suitable for an electronic device. The electronic device includes a chassis. The chassis is disposed in a rack. The rack has at least one electrically connecting terminal. The electrically connecting module includes a shell, an adjustable position-limiting element, a circuit board and at least one first connector. The adjustable position-limiting element connects the shell to the chassis and forms an adjusting space area between the shell and the chassis. The shell is able to move relatively to the chassis in the adjusting, space area. The circuit board is disposed in the shell and has a first connecting end corresponding to the chassis and a second connecting end corresponding to the electrically connecting terminal on the rack. The first connector is disposed on the circuit board and electrically connected to the second connecting end. When the chassis enters the rack, the electrically connecting terminal presses the shell to adjust the position of the shell, such that the first connector is physically and electrically connected to the corresponding electrically connecting terminal. When the chassis is pulled out from the rack, the first connector is moved with the chassis such that a physical connection and a electrical connection between the first connector and the electrically connecting terminal on the rack are terminated.

In one embodiment of the invention, the electrically connecting module further includes a shell connected to a back side of chassis. The circuit board is disposed inside the shell. The shell is connected to the chassis through an adjustable position-limiting element which forms an adjusting space area between the shell and the chassis. The shell can move relative to the chassis within the adjusting space area. When the chassis enters the rack, the electrically connecting terminal presses the shell to adjust a position of the shell, such that the first connector is physically and electrically connected to the corresponding electrically connecting terminal. When the chassis is pulled out from the rack, the first connector is moved with the chassis such that a physical connection and a electrical connection between the first connector and the electrically connecting terminal is terminated.

In one embodiment of the invention, the electronic device further includes a positioning element. One part of the positioning element is disposed on the rack, another part of positioning element is disposed on the shell and corresponding to the part of positioning element on the rack. When the chassis enters the rack, a position of the shell is adjusted by a force transferred from the positioning element such that the positioning element is converted form a separated state into a integrated state to position the shell, and then the first connector is physically and electrically connected with the corresponding electrically connecting terminal.

In one embodiment of the invention, the positioning element includes a positioning pillar disposed on the rack and positioning holes disposed in the shell. When the chassis enters the rack, a position of the shell is adjusted by a force transferred from the positioning pillar to the shell such that the positioning pillar is inserted into the positioning hole, and then the first connector is physically and electrically connected to the corresponding electrically connecting terminal.

In one embodiment of the invention, the positioning hole contains a section of trumpet shaped guide wall. An opening of guide wall narrows from outside in.

In one embodiment of the invention, the adjustable position-limiting element is elastic.

In one embodiment of the invention, the adjustable position-limiting element includes elastic pillars disposed between the shell and the chassis. Two ends of each of the elastic pillars are fixed onto the shell and the chassis respectively. When the relative position between the shell and the chassis changes, each of the elastic pillars receives a force and is elastically deformed.

In one embodiment of the invention, the adjustable position-limiting element includes elastic pieces disposed between the shell and the chassis. When a relative position between the shell and chassis changes, each of the elastic pieces receives a force and is elastically deformed.

In one embodiment of the invention, the adjustable position-limiting element includes several first locking elements and several elastic elements. The first locking elements go through the shell to lock into the chassis. Each of the first locking elements has a stopper. The elastic elements are respectively compressed between the stoppers and the shell. When a relative position between the shell and the chassis changes, each of the elastic elements receives a force and is elastically deformed.

In one embodiment of the invention, the shell has a panel and lock holes disposed on the panel. The first locking elements go through the lock holes respectively to lock into the chassis. This panel is placed between the stoppers and the chassis. The elastic elements are compressed between the stoppers and the panel.

In one embodiment of the invention, each of the elastic elements is a compressed spring attached around the corresponding first locking element.

In one embodiment of the invention, a back side of the chassis has a wall which has an opening. A slot is formed on the shell and corresponding to the opening. The first connecting end of the circuit board goes through the opening and the slot into the chassis. The circuit board further has a second connector. The second connector is electrically connected to the first connecting end.

In one embodiment of the invention, the electrically connecting module further includes a main board module disposed inside the chassis. Wherein the second connector is electrically connected to the main board module through a wire.

In one embodiment of the invention, the shell has at least one opening. The first connector goes through the opening to connect to the rack.

In one embodiment of the invention, the electronic device further includes second locking elements which lock the circuit board to the shell.

From the above descriptions, the invention provides an electrically connecting module disposed in the chassis of an electronic device. When the chassis is placed in a rack, the first connector of the electrically connecting module connects electrically to the rack and through this connection brings power and signals to the chassis. There is no longer a need to use cables to connect the chassis to the rack. Therefore, the number of cables present in the rack are greatly reduced which makes management much easier. In addition, air flow inside the rack is increased which results in better heat dissipation.

Furthermore, the invention provides an electrically connecting module which can move within an adjusting space area to adapt to the electrically connecting terminal on the rack. This adaptive action prevents wrongful connection between the electrically connecting module and the electrically connecting terminal on the rack in case the chassis is not placed in right position. It prevents damages to the electrically connecting terminal or components in electronic device.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
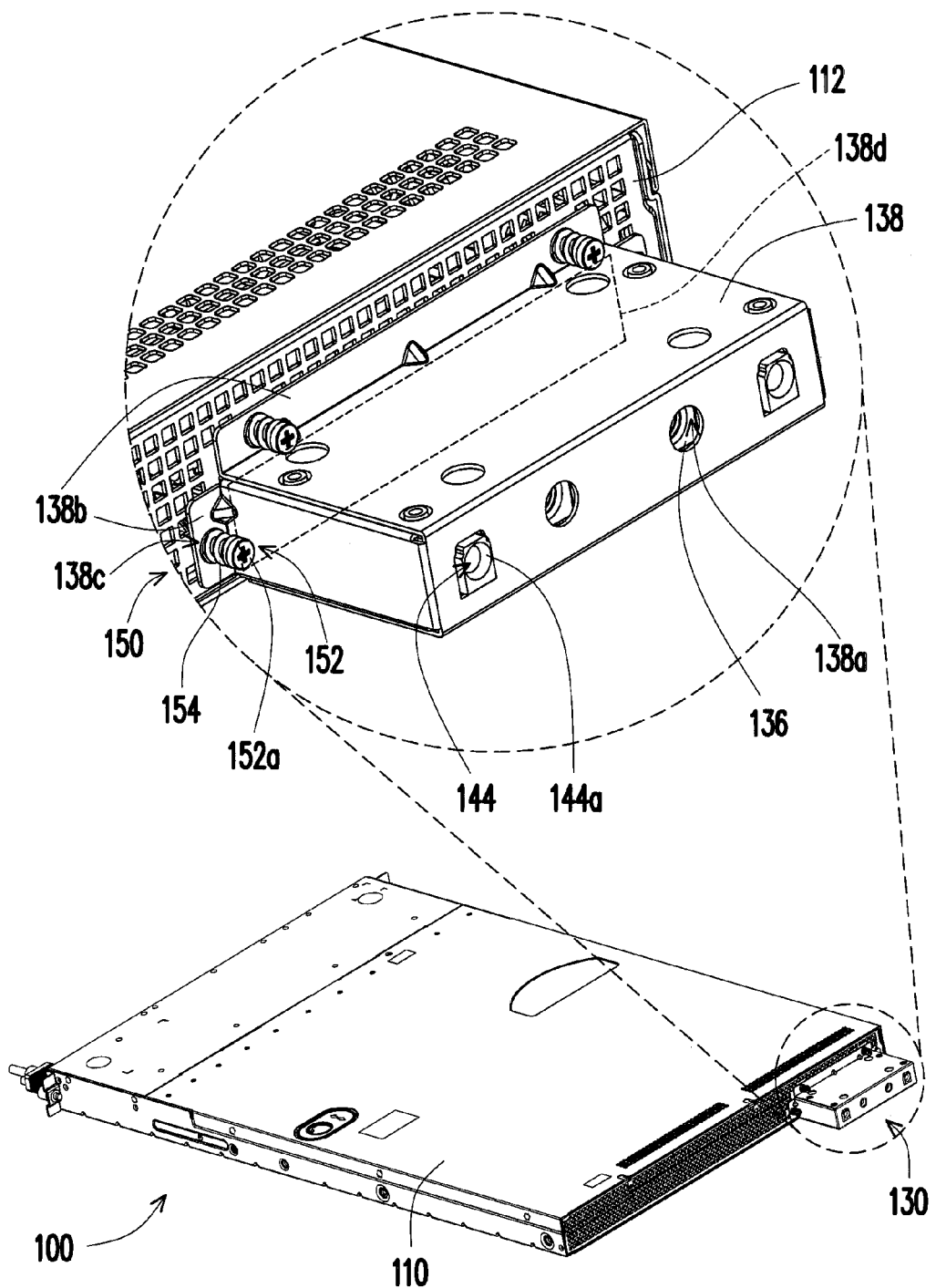
FIG. 1 is a three dimensional drawing which shows the electrically connecting module according to an embodiment of the invention connects to a server.
Figure 2:
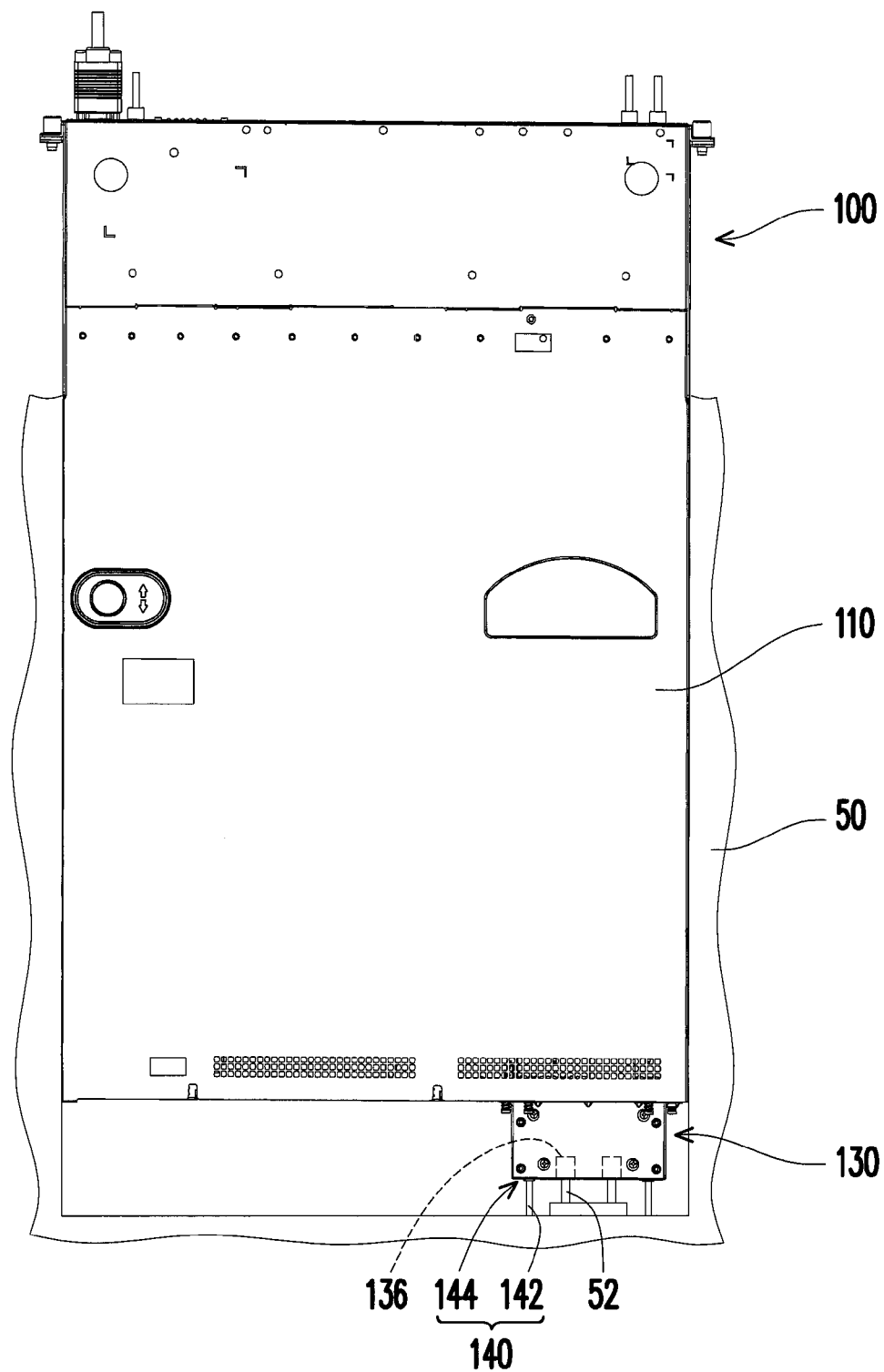
FIG. 2 is a partial top view of the server in FIG. 1 disposed in a server rack.
Figure 3:
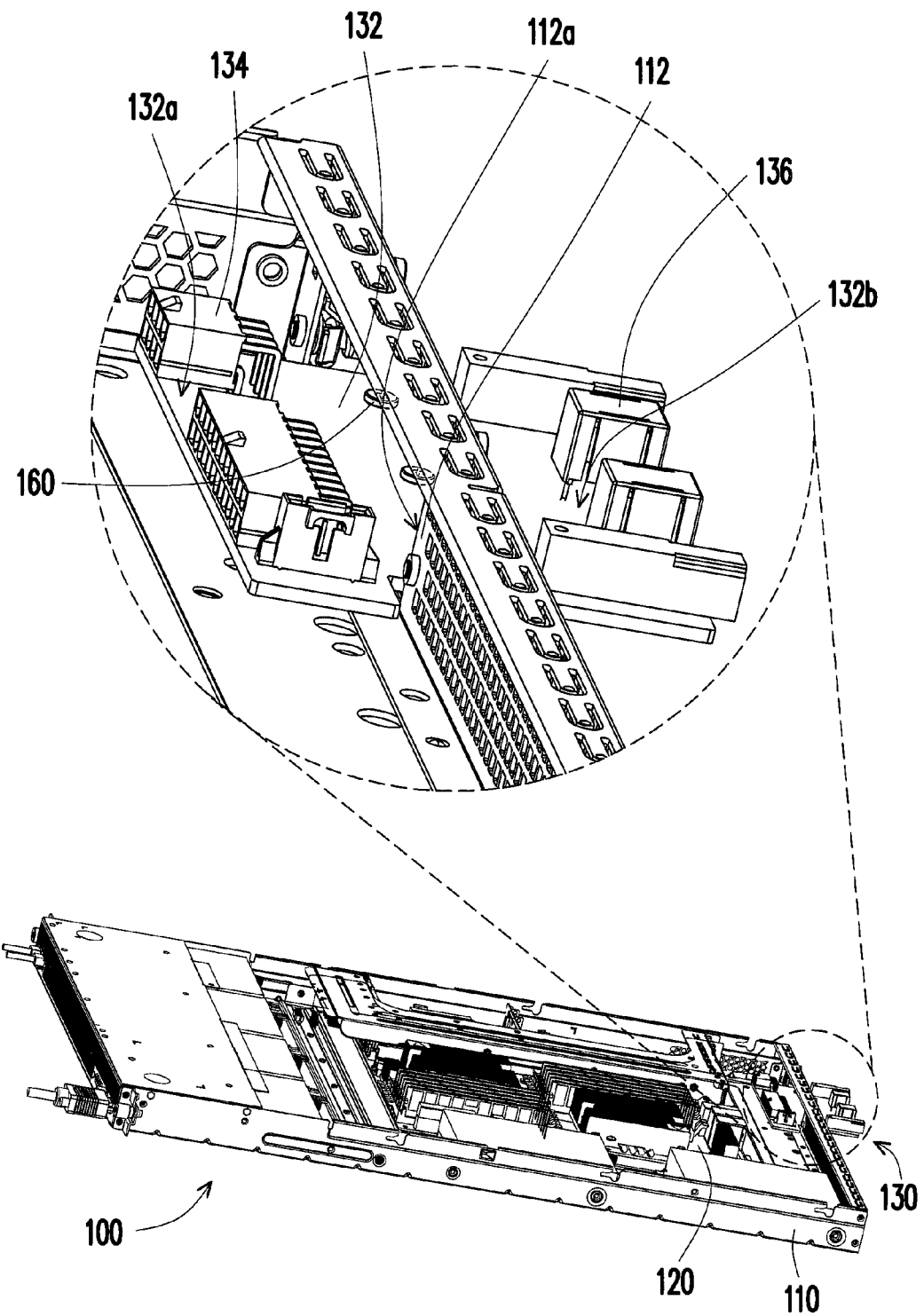
FIG. 3 is a three dimensional drawing of several components in the server of FIG. 1.

FIG. 1 is a three dimensional drawing which shows the electronic device according to an embodiment of the invention. FIG. 2 is a top view of the electronic device in FIG. 1 disposed in a rack. FIG. 3 is a three dimensional drawing of several components of the electronic device of FIG. 1. Referring to FIGS. 1, 2, and 3, in this embodiment, an electronics device 100, a server for example, includes a chassis 110, a main board module 120, and an electrically connecting module 130. The chassis 110 is slidably disposed in the rack 50, and the main board module 120 is disposed inside the chassis 110. There is at least one electrically connecting terminal 52 on the rack 50. The electronic device 100 uses the electrically connecting module 130 to connect electrically to the rack 50.

The electrically connecting module 130 includes a circuit board 132, at least one connector 134 and at least one connector 136. Circuit board 132 has a first connecting end 132a corresponding to the main board module 120 and a second connecting end 132b corresponding to the rack 50. The connector 134 disposed on the circuit board 132 connects electrically to the first connecting end 132a, and the first connecting end 132a uses the connector 134 to connect electrically to the main board module 120. The connector 136 disposed on the circuit board 132 connects electrically to the second connecting end 132b. The connector 134 connects electrically to the main board module 120 using wires for example (not shown in drawing).

Figure 4:
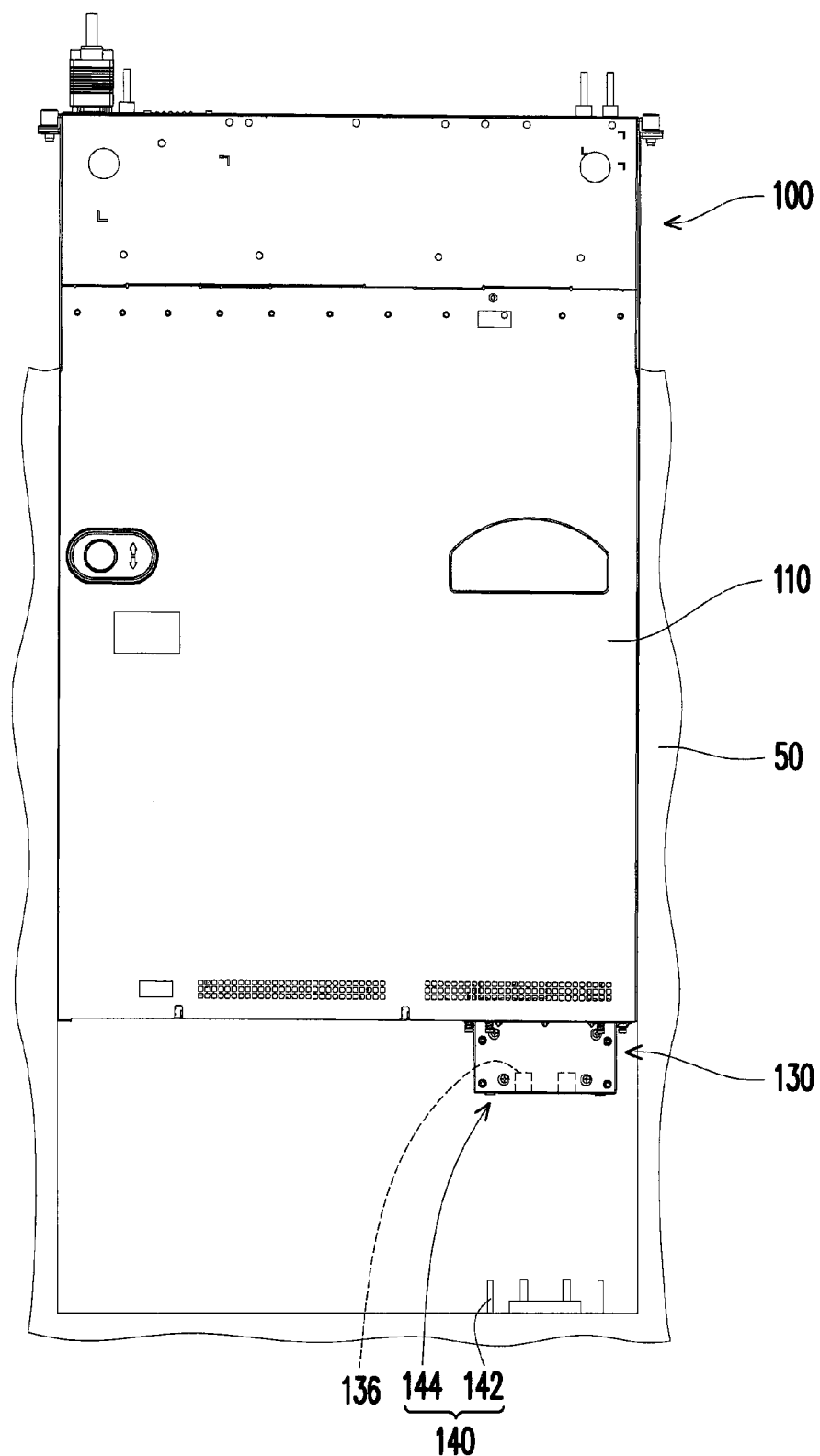
FIG. 4 shows the server of FIG. 2 being pulled out from the server rack.

FIG. 4 shows the electronic device of FIG. 2 being pulled out of the rack. When the chassis 110 as shown in FIG. 2 is placed inside the rack 50, the connector 136 connects electrically to the electrically connecting terminal 52 on the rack 50. When the chassis 110 as shown in FIG. 4 is pulled out of the rack 50, the connector 136 moves with the chassis 110 to terminate electrical connection between the connector 136 and the electrically connecting terminal 52.

As described in the above, when the chassis 110 is placed inside the rack 50, the connector 136 of the electrically connecting module 130 connects electrically to the rack 50, thereby the main board module 120 within the chassis 110 uses the electrically connecting module 130 to hot plug into the rack 50 to receive power and signals. It is not necessary to use cables to electrically connect the main board module 120 to the rack 50. Therefore, the number of cables used within the rack 50 are greatly reduced which makes management much easier. In addition, air flow inside the rack 50 is increased which results in better heat dissipation.

Furthermore, the electrically connecting module 130 can move within an adjusting space area to adapt to the electrically connecting terminal 52 on the rack 50. This adaptive action prevents wrongful connection between the electrically connecting module 130 and the electrically connecting terminal 52 on the rack 50 in case the chassis 110 is not placed in right position. It prevents damages to the electrically connecting terminal 52 or components in the electronic device 100.

In one current embodiment, the electrically connecting module 130 further includes a shell 138 which connects to the back side of chassis 110. The circuit board 132 is disposed in the shell 138, and the shell 138 uses the adjustable position-limiting element 150 to connect to the chassis 110. The adjustable position-limiting element 150 has flexibility by including several first locking elements 152 and several elastic elements 154. The first locking elements 152 go through the shell 138 to lock into the chassis 110. Each of the first locking elements 152 has a stopper 152a. The elastic elements 154 are respectively compressed between the stoppers 152a and the shell 138. When the relative position between the shell 138 and the chassis 110 changes, a force exerted on the elastic elements 154 causes them to elastically deform.

Elastic deformation of the elastic elements 154 enable the adjustable position-limiting element 150 to form an adjusting space area between the shell 138 and the chassis 110. The shell 138 can move within the adjusting space area to change its relative position to the chassis 110. As shown in FIG. 2, when the chassis 110 is pushed into the rack 50, the electrically connecting terminal 52 presses the shell 138 to adjust its position such that the connector 136 is connected both physically and electrically to the corresponding electrically connecting terminal 52. When the chassis 110 is pulled out from the rack 50, the connector 136 is moved with the chassis 110 such that the physical and electrical connection between the connector 136 and the electrically connecting terminal 52 are terminated.

In a current embodiment, the shell 138 includes a panel 138b and many lock holes 138c disposed on panel 138b. The first locking elements 152 go through the lock holes 138c respectively to lock into the chassis 110. The panel 138b is placed between the stoppers 152a and the chassis 110. The elastic elements 154 are compressed between the stoppers 152a and the panel 138b. Each of the elastic elements 154 is a compressed spring, for example, attached around the corresponding first locking elements 152.

Figure 5:
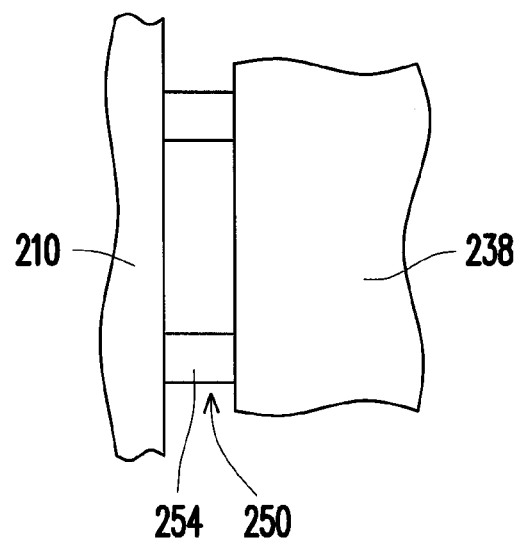
FIG. 5 shows the adjustable position-limiting element of another embodiment of the invention.

FIG. 5. shows another embodiment of an adjustable position-limiting element in the invention. In the embodiment shown in FIG. 5, the adjustable position-limiting element 250 includes several elastic pillars 254 disposed between the shell 238 and the chassis 210. The two ends of the elastic pillars 254 are fixed onto the shell 238 and the chassis 210 respectively. When the relative position between the shell 238 and the chassis 210 changes, a force exerted on the elastic pillars 254 causes them to elastically deform. Therefore they provide the same result as the elastic elements 154 in first embodiment.

Figure 6:
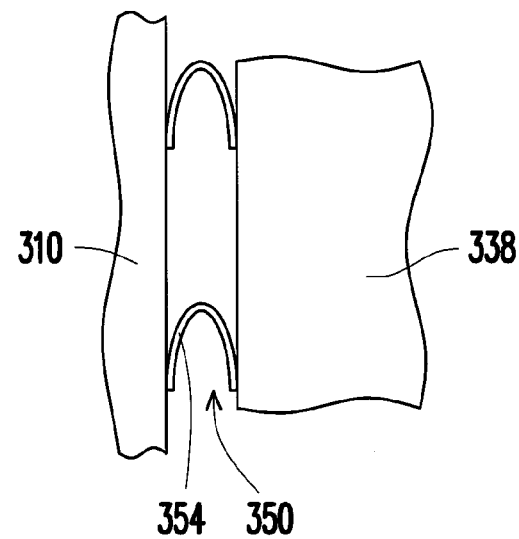
FIG. 6 shows the adjustable position-limiting element of yet another embodiment of the invention.

FIG. 6. shows yet another embodiment of adjustable position-limiting element in this invention. In the embodiment shown in FIG. 6, the adjustable position-limiting element 350 includes several elastic pieces 354 disposed between the shell 338 and the chassis 310. When the relative position between the shell 338 and the chassis 310 changes, a force exerted on the elastic pieces 354 causes them to elastically deform. Therefore they provide the same result as the elastic elements 154 in first embodiment.

Referring to FIGS. 1 and 3, in this embodiment, the back side of the chassis 110 has a wall 112 which has an opening 112a. In the corresponding position on the shell 138, there is a slot or opening 138d. The first connecting end 132a of the circuit board 132 extends through the opening 138d and the opening 112a into the chassis 110.

Referring to FIG. 1, in this embodiment, the electrically connecting module 130 includes the shell 138, the shell 138 is disposed in the chassis 110 and covers the connector 136 and the second connecting end 132b (shown in FIG. 3). The shell 138 has at least one opening 138a, and the second connector 136 goes through the opening 138a to connect electrically to the rack 50 (shown in FIG. 2). Furthermore, referring to FIG. 3, in this embodiment, the electronic device 100 includes several second locking elements 160, and the second locking elements 160 lock the circuit board 132 to the shell 138.

Refer to FIGS. 1, 2 and 4, in this embodiment, the electronic device 100 further includes a positioning element 140. One part of the positioning element 140 is disposed in the rack 50, another part of the positioning element 140 is disposed in the shell 138 and corresponding to the part of the positioning element 140 on the rack 50. When the chassis 110, as shown in FIG. 2, is pushed into the rack 50, a position of the shell 138 is adjusted by a force transferred from the positioning element 140 such that the positioning element 140 is converted from a separated state into a integrated state to position the shell 138, and then the connector 136 is physically and electrically connected with the corresponding electrically connecting terminal 52.

For more detailed description, the positioning element 140 includes positioning pillars 142 disposed on rack 50 and positioning holes 144 disposed on the shell 138. When the chassis 110 as shown in FIG. 2 is pushed into the rack 50, a position of the shell 138 is adjusted by a force transferred from the positioning pillars 142 to the shell 138 such that the positioning pillars 142 is inserted into the positioning holes 144 respectively, and then the connector 136 is physically and electrically connected to the corresponding electrically connecting terminal 52. In this embodiment, each of the positioning holes 144 contains a section of trumpet shaped guide wall 144a. The opening of the guide wall 144a narrows from outside in, thereby the positioning pillar 142 can follow the guide of the trumpet shaped guide wall 144a to insert properly into the positioning hole 144.

From the above descriptions, the invention provides an electrically connecting module disposed in the chassis of an electronic device. When the chassis is placed into a rack, the first connector of the electrically connecting module connects electrically to the rack and through this connection brings power and signals to the chassis. There is no longer a need to use cables to connect the chassis to the rack. Therefore, the number of cables present in rack is greatly reduced which makes management much easier. In addition, air flow inside the rack is increased which results in better heat dissipation.

Furthermore, the invention provides an electrically connecting module which can move within an adjusting space area to adapt to the electrically connecting terminal on the rack. This adaptive action prevents wrongful connection between the electrically connecting module and the connecting terminal on the rack in case the chassis is not placed in right position. It prevents damages to the connecting terminal or components in the electronic device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electrically connecting module suitable for an electronic device that includes a chassis disposed in a rack that has at least one electrically connecting terminal, the electrically connecting module comprising:
   a shell;
   an adjustable position-limiting element, connecting the shell to the chassis and forming an adjusting space area between the shell and the chassis, wherein the shell is able to move relative to the chassis within the adjusting space area;
   a circuit board, disposed in the shell and having a first connecting end corresponding to the chassis and a second connecting end corresponding to the electrically connecting terminal of the rack; and
   at least one first connector, disposed on the circuit board and electrically connected to the second connecting end, wherein when the chassis enters the rack, the electrically connecting terminal presses the shell to adjust the position of the shell, such that the first connector is physically and electrically connected to the electrically connecting terminal, and when the chassis is pulled away from the rack, the first connector is moved with the chassis such that a physical connection and a electrical connection between the first connector and the electrically connecting terminal are terminated.

2. The electrically connecting module as claimed in claim 1, further comprising a positioning element, wherein one part of the positioning element is disposed on the rack, and another part of the positioning element is disposed on the shell and corresponds to the part of the positioning element on the rack;
   wherein when the chassis enters the rack, a position of the shell is adjusted by a force transferred from the positioning element such that the positioning element is converted from a separated state into a integrated state to position the shell, and then the first connector is physically and electrically connected with the corresponding electrically connecting terminal.

3. The electrically connecting module as claimed in claim 2, wherein the positioning element comprises a positioning pillar disposed on the chassis and a positioning hole disposed on the shell, where when the chassis enters the rack, a position of the shell is adjusted by a force transferred from the positioning pillar to the shell such that the positioning pillar is inserted into the positioning hole, and then the first connector is physically and electrically connected to the corresponding electrically connecting terminal.

4. The electrically connecting module as claimed in claim 3, wherein the positioning hole contains a section of trumpet shaped guide wall, and an opening of the guide wall narrows from outside in.

5. The electrically connecting module as claimed in claim 1, wherein the adjustable position-limiting element is elastic.

6. The electrically connecting module as claimed in claim 5, wherein the adjustable position-limiting element comprises a plurality of elastic pillars disposed between the shell and the chassis, two ends of each of the elastic pillars are fixed onto the shell and the chassis respectively, wherein when a relative position between the shell and the chassis changes, each of the elastic pillars receives a force and is elastically deformed.

7. The electrically connecting module as claimed in claim 5, wherein the adjustable position-limiting element comprises a plurality of elastic pieces disposed between the shell and the chassis, wherein when a relative position between the shell and the chassis changes, each of the elastic pieces receives a force and is elastically deformed.

8. The electrically connecting module as claimed in claim 5, wherein the adjustable position-limiting element comprises:
   a plurality of first locking elements going through the shell to lock into the chassis, wherein each of the first locking elements has a stopper; and
   a plurality of elastic elements respectively compressed between the stoppers and the shell, wherein when a relative position between the shell and the chassis changes, each of the elastic elements receives a force and is elastically deformed.

9. The electrically connecting module as claimed in claim 8, wherein the shell has a panel and a plurality of lock holes disposed on the panel, the first locking elements go through the lock holes respectively to lock into chassis, the panel is placed between the stoppers and the chassis, and the elastic elements are respectively compressed between the stoppers and the panel.

10. The electrically connecting module as claimed in claim 9, wherein each of the elastic elements is a compressed spring attached around the corresponding first locking element.

11. The electrically connecting module as claimed in claim 1, wherein a back side of the chassis has a wall having an opening, a slot is formed on the shell that corresponds to the opening, the first connecting end of the circuit board goes through the opening and the slot into the chassis, the circuit board further has a second connector, and the second connector is electrically connected to the first connecting end.

12. The electrically connecting module as claimed in claim 11, further comprising a main board module disposed inside the chassis, wherein the second connector is electrically connected to the main board module through a wire.

13. The electrically connecting module as claimed in claim 1, wherein the shell has at least one opening, and the first connector goes through the opening to connect to the rack.

14. The electrically connecting module as claimed in claim 1, further comprising a plurality of second locking elements, wherein the second locking elements lock the circuit board to the shell.

* * * * *